(12) United States Patent
Lee

(10) Patent No.: US 6,713,802 B1
(45) Date of Patent: Mar. 30, 2004

(54) MAGNETIC TUNNEL JUNCTION PATTERNING USING SIC OR SIN

(75) Inventor: Gill Yong Lee, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/600,661

(22) Filed: Jun. 20, 2003

(51) Int. Cl.$^7$ ................................................ H01L 21/00
(52) U.S. Cl. ................ 257/295; 257/303; 257/421; 438/3; 438/253
(58) Field of Search ................ 257/295–310, 257/421–427; 438/3, 238–256, 381–399

(56) References Cited

U.S. PATENT DOCUMENTS 6,376,260 B1 * 4/2002 Chen et al. .............. 438/3

OTHER PUBLICATIONS

Kovacs, Gregory T.A., "Micromachined Transducers Sourcebook," 1998, p. 79, WCB/McGraw–Hill, United States of America.

"Case Western Reserve University MEMS Resource, SiC MEMS at CWRU," www.mems.cwru.edu/SiC, May 15, 2003, pp. 1–3.

* cited by examiner

Primary Examiner—H. Jey Tsai
(74) Attorney, Agent, or Firm—Slater & Matsil, L.L.P.

(57) ABSTRACT

A material that is harder than silicon dioxide is used as a hard mask to pattern the soft layer of an MTJ stack of a magnetic memory device, which increases the process window for post-MTJ stack planarization. The soft layer hard mask material may comprise SiC, SiON, SiCN or SiN or another dielectric material having a Young's modulus greater than the Young's modulus of silicon dioxide. A hard fill dielectric material is also used as an insulating material over the hard mask used to pattern the soft layer. The fill dielectric material may also comprise SiC, SiON, SiCN or SiN or another dielectric material having a Young's modulus greater than the Young's modulus of silicon dioxide.

26 Claims, 4 Drawing Sheets

MAGNETIC TUNNEL JUNCTION PATTERNING USING SIC OR SIN

This application relates to the following co-pending and commonly assigned patent application: Ser. No. 10/600,057, filed Jun. 20, 2003, entitled, "Subtractive Stud Formation for MRAM Manufacturing."

TECHNICAL FIELD

The present invention relates generally to the fabrication of semiconductor devices, and more particularly to the fabrication of magnetic random access memory (MRAM) devices.

BACKGROUND

A more recent development in semiconductor memory devices involves spin electronics, which combines semiconductor technology and magnetics. The spin of an electron, rather than the charge, is used to indicate the presence of a "1" or "0". One such spin electronic device is a magnetic random access memory (MRAM), which includes conductive lines positioned in a different direction, e.g., perpendicular to one another in different metal layers, the conductive lines sandwiching a magnetic stack or magnetic tunnel junction (MJT), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic memory cell depends on the moment's alignment. The stored state is read from the magnetic memory cell by detecting the component's resistive state.

An advantage of MRAMs compared to traditional semiconductor memory devices such as dynamic random access memory devices (DRAMs) is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data. Therefore, MRAM devices are replacing flash memory, DRAM and static random access memory devices (SRAM) devices.

A magnetic stack comprises many different layers of metals and magnetic metals, and a thin layer of dielectric material having a total thickness of a few tens of nanometers. The magnetic stacks are typically built on top of copper wires embedded in an inter-level dielectric (ILD) material. The magnetic tunnel junctions (MTJ's) are positioned at intersections of underlying first conductive lines and overlying second conductive lines. MRAM devices are typically manufactured by forming a plurality of magnetic metal stacks arranged in an array, which comprise the magnetic memory cells. A memory cell array typically has conductive lines in a matrix structure having rows and columns.

One type of MRAM array uses a transistor to select each magnetic memory cell. Another type, a cross-point array, comprises an array of magnetic bits or magnetic stacks situated at the cross-points between two conductive lines. Information is stored in one of the magnetic layers of the magnetic stacks. To store the information, a magnetic field is necessary. In a cross-point array, this magnetic field is provided by a wordline and bitline current which is passed through conductive lines. Information is stored in the magnetic memory cells by aligning the magnetization of one ferromagnetic layer (information layer) either parallel or antiparallel to a second magnetic layer (reference layer). The information is detectable due to the fact that the resistance of the element in the parallel case is different from the antiparallel case. Magnetic stacks or memory cells in a cross-point array are usually selected by passing sub-threshold currents through the conductive lines, e.g., in both the x- and y-direction, and where the conductive lines cross at the cross-points, the combined magnetic field is large enough to change the magnetic orientation.

A critical challenge in MRAM technology is the patterning of the MTJ stack material. Because a MTJ stack includes a very thin junction layer, typically 10–20 Angstroms of aluminum oxide, shorting around the junction is a critical problem. In addition, interconnecting with the upper wiring level, e.g., the top magnetic layer of the magnetic stack is challenging due to the thin layers used in the MTJ stack which are easily damaged during etch processes.

SUMMARY OF THE INVENTION

These and other problems are generally solved or circumvented, and technical advantages are generally achieved, by preferred embodiments of the present invention, which provides an improved method of patterning a MTJ stack. A material that is harder than silicon dioxide is used as a hard mask to pattern the soft layer of the MTJ stack, which increases the process window for post-MTJ stack planarization. The hard mask provides an etch stop for the trench etch stop to interconnect the MTJ to upper wiring levels. A dielectric fill material is used over the soft layer hard mask that has an increased hardness compared to that of silicon dioxide.

In accordance with a preferred embodiment of the present invention, a method of forming a bottom electrode of a magnetic memory cell includes depositing a pinning layer over a workpiece, depositing a soft layer material over the pinning layer, and depositing a first hard mask over the soft layer material, the first hard mask comprising a conductive material. The first hard mask is patterned, and the first hard mask is used to pattern the soft layer material and form at least one magnetic memory cell. A second hard mask is deposited over the first hard mask and exposed portions of the pinning layer, the second hard mask comprising a dielectric material having a Young's modulus greater than the Young's modulus of silicon dioxide. The second hard mask is patterned, and the second hard mask is used to pattern the pinning layer and form a bottom electrode.

In accordance with another preferred embodiment of the present invention, a method of manufacturing a magnetic memory device includes providing a workpiece, depositing a first insulating layer over the workpiece, and forming at least one first conductive line in the first insulating layer. A second insulating layer is deposited over the at least one first conductive line and first insulating layer, and a via is formed within the second insulating layer, wherein the via abuts the at least one first conductive line. A pinning layer is deposited over the via and second insulating layer, a soft layer material is deposited over the pinning layer, and a first hard mask is deposited over the soft layer material, the first hard mask comprising a conductive material. The first hard mask is patterned, and the first hard mask is used to pattern the soft layer material and form at least one magnetic memory cell. A second hard mask is deposited over the first hard mask and exposed portions of the pinning layer, the second hard mask comprising a dielectric material having a Young's modulus greater than the Young's modulus of silicon dioxide. The method includes patterning the second hard mask, using the second hard mask to pattern the pinning layer, and depositing a third insulating layer over the second hard mask, the third hard mask comprising a dielectric material having a Young's modulus greater than the Young's modulus of silicon dioxide. The workpiece is then planarized to remove portions of the third insulating layer from over a top surface of the first hard mask.

In accordance with yet another embodiment of the present invention, a magnetic memory device includes a workpiece, at least one first conductive line disposed over the workpiece, a pinning layer coupled to the at least one first conductive line, and a soft layer disposed over the pinning layer. The soft layer comprises a magnetic memory cell. A first hard mask is disposed over the soft layer, the first hard mask having substantially the same lateral dimensions as the soft layer, and the first hard mask being conductive. A second hard mask is disposed over the pinning layer, the top surface and sidewalls of the first hard mask, and over the sidewalls of the soft layer, wherein the second hard mask comprises substantially the same lateral dimensions as the pinning layer, and wherein the second hard mask comprises SiC, SiON, SiCN or SiN. A first insulating layer is disposed over at least the second hard mask, wherein the first insulating layer comprises SiC, SiON, SiCN or SiN. At least one second conductive line is disposed over and abutting the first hard mask, wherein the at least one second conductive line runs in a different direction than the at least one first conductive line.

Advantages of embodiments of the invention include providing a method of patterning a bottom electrode of a magnetic memory cell that avoids exposing the soft layer of the magnetic stack to harsh etchant chemistries after the soft layer is patterned. A hard mask comprising SiC, SiON, SiCN or SiN is used to pattern the pinning layer, and this hard mask is not completely removed during the patterning of the bottom electrode or pinning layer. Because the third hard mask resides over the top surface and sidewalls of the hard mask over the patterned soft layer, and over the sidewalls of the patterned soft layer, the soft layer is protected during the pinning layer etch. This results in a more reliable MRAM device and improves device performance. Because of the presence of the first hard mask during the planarization step to remove a subsequently deposited insulating layer (e.g., over the patterned soft layer), the soft layer is also not exposed to any damaging chemistries during the planarization step.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. Embodiments of the present invention may also be applied, however, to other magnetic memory cell designs and magnetic semiconductor device applications. Only one magnetic memory cell is shown in each figure, although many other magnetic memory cells and elements may also be formed within the layers shown.

Figure 1:
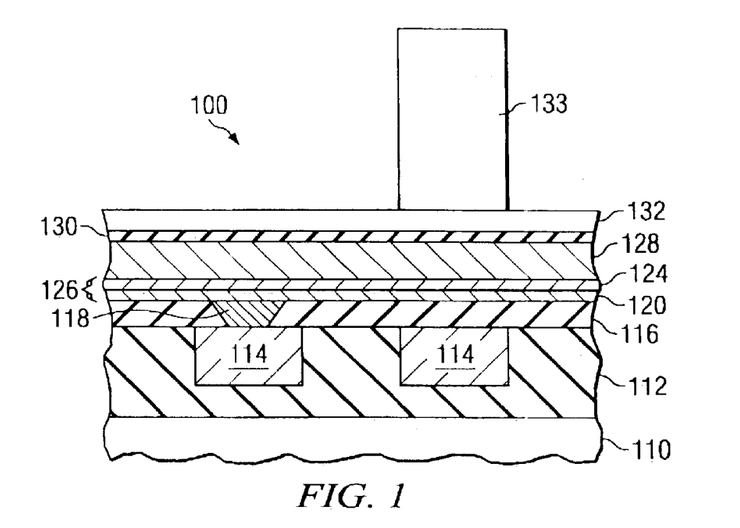
FIGS. 1 through 10 show cross-sectional views of a method of manufacturing an MRAM device in accordance with an embodiment of the present invention.

FIGS. 1 through 10 show cross-sectional views of a method of manufacturing a magnetic memory device 100 in accordance with an embodiment of the present invention. Referring first to FIG. 1, a workpiece 110 is provided. The workpiece 110 may comprise one or more layers of a dielectric such as silicon oxide or low-k dielectric materials disposed over silicon single-crystal silicon, for example. The workpiece 110 may include other conductive layers or other semiconductor elements, such as transistors, or diodes, as examples.

A first insulating layer 112 is deposited or formed over the workpiece 110. The first insulating layer 112 may comprise an inter-level dielectric, and may comprise silicon dioxide, for example. Preferably, using a damascene process, the first insulating layer 112 is patterned for first conductive lines, and a conductive material is deposited over the workpiece 110 to fill the patterned first insulating layer 112 and first conductive lines 114. Excess conductive material is then removed from the top surface of the first insulating layer 112, using a chemical-mechanical polish (CMP) process, for example.

If the first conductive lines 114 comprise copper, the first conductive lines 114 are typically formed in a damascene process, as described. However, alternatively, the first conductive lines 114 may be formed by the deposition of a conductive material such as aluminum, an aluminum alloy or other metals, patterning and etching of the conductive material, and the deposition of a first insulating layer 112 between the first conductive lines 114, (not shown).

A second insulating layer 116 is deposited over the first conductive lines 114 and the first insulating layer 112. The second insulating layer 116 may comprise the same material as the first insulating layer 112, for example. The second insulating layer 116 is patterned, and a conductive material is deposited over the second insulating layer 116 to form vias 118 in the second insulating layer 116 that make electrical contact to the first conductive lines 114. The via 118 conductive material may comprise copper, tungsten or other metals, for example. Excess conductive material is removed from the top surface of the second insulating layer 116, e.g., using CMP.

Next, a pinning layer 120 is deposited over the second insulating layer 116. The pinning layer 120 typically comprises a layer of TaN deposited over the second insulating layer 116, a layer of Ta deposited over the TaN layer, and a layer of PtMn or IrMn deposited over the Ta layer. The TaN layer may comprise a thickness of 50 to 100 Angstroms, the Ta layer may comprise a thickness of 50 to 100 Angstroms, and the PtMn layer may comprise a thickness of 125 to 300 Angstroms, as examples. The TaN layer and Ta layer function as a seed layer for the PtMn layer. The pinning layer 120 functions as a pinning layer for the free layer of the soft layer 124 of the magnetic stack, and also as a bottom electrode to electrically connect the free layer to the underlying first conductive line 114 (by the via 118), to be described further herein.

A soft layer 124 is then formed over the pinning layer 120, as shown in FIG. 1. The soft layer 124 includes a first magnetic layer deposited over the pinning layer 120, a thin insulating layer deposited over the first magnetic layer, and a second magnetic layer deposited over the thin insulating layer.

The first magnetic layer may comprise a layer of TaN over a layer of NiFe and optional additional magnetic layers. The first magnetic layer of the soft layer 124 is often referred to as a fixed layer because its magnetic polarization direction is fixed during device operation by the underlying pinning layer 120, which increases the coercive field of the fixed layer. The pinning layer 120 is an anti-ferromagnetic layer that pins the magnetization of the fixed layer.

The thin insulating layer of the soft layer 124 is referred to as the tunnel barrier or tunnel junction. The thin insulating layer may comprise 20 Angstroms or less of aluminum oxide, for example.

The second magnetic layer of the soft layer 124 may comprise a layer of CoFe, a layer of Ru deposited over the CoFe, a layer of CoFe deposited over the Ru, and optional additional magnetic layers, for example. The second magnetic layer is referred to as a free layer because the magnetic polarization direction may rotate depending on the magnetic field, which is how information is written to or stored in the MRAM device 100. The soft layer 124 and the underlying pinning layer 120 are often collectively referred to as a magnetic tunnel junction (MTJ) material stack or MTJ stack 126. The thickness of the soft layer 124 may comprise a thickness of 500 Angstroms, +/−200 Angstroms, approximately, for example.

A first hard mask 128 is deposited over the soft layer 124. The first hard mask 128 preferably comprises a conductive material. For example, the first hard mask 128 may comprise a metal such as TiN, and may alternatively comprise TaN, Ta, Ti, Pt, PtMn, Ru, IrMn, or Al, as examples, although the first hard mask 128 may also comprise other materials. An optional second hard mask 130 may be deposited over the first hard mask 128. The second hard mask 130 may comprise $SiO_2$ or alternatively may comprise SiN, as examples. An anti-reflective coating (ARC) 132 is deposited over the second hard mask 130, or over the first hard mask 128, when a second hard mask 130 is not used. A photoresist 133 is deposited over the ARC 132, as shown, and the photoresist 133 is patterned with the pattern that will be used to pattern the soft layer 124.

Figure 2:
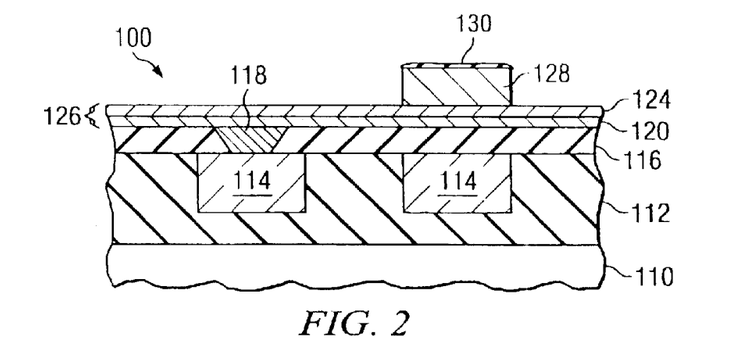

Shown in FIG. 2, first, the ARC 132 is opened, and the second hard mask 130 is patterned using a reactive ion etch (RIE), for example. The photoresist 133 is stripped, and the first hard mask 130 is patterned, e.g., using a RIE, using the second hard mask 130 as a mask. Alternatively, the photoresist 133 may be left remaining while the first hard mask 128 is patterned.

Figure 3:
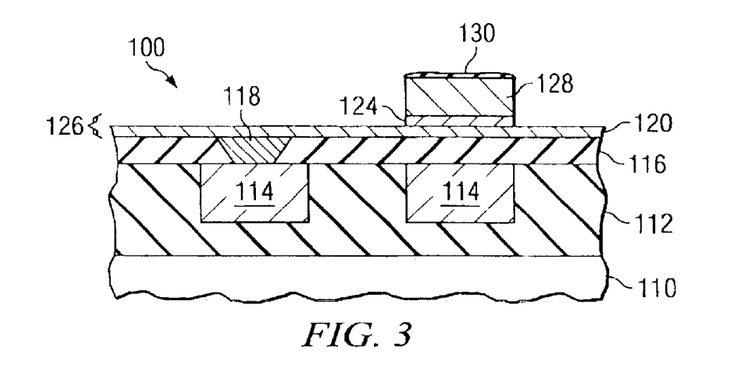

Next, the first hard mask 128 and second hard mask 130 (if the optional second hard mask 130 is included) are used to pattern the underlying soft layer 124, using a RIE process, as shown in FIG. 3. The optional second hard mask 130 minimizes consumption of the first hard mask 128 during the patterning of the soft layer 124. At this point, the free layer, tunnel junction and fixed layer of the soft layer 124 have been patterned, and the pinning layer 120 is unpatterned. Because the first hard mask 128 is used to pattern the soft layer 124, the soft layer 124 has substantially the same lateral dimensions, e.g., in the direction perpendicular to the workpiece 110 surface, as the first hard mask 128.

Figure 4:
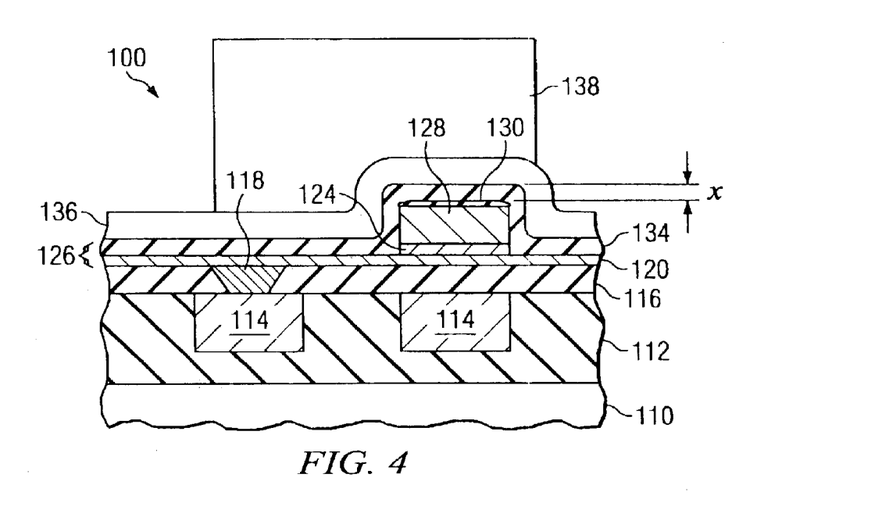

Next, in accordance with an embodiment of the present invention, any remaining photoresist 133 is stripped, and a third hard mask 134 is deposited Over exposed portions of the pinning layer 120, the patterned soft layer 124 and the first hard mask 128 and second hard mask 130 (if the optional second hard mask 130 is used) left remaining on the workpiece 110. The third hard mask 134 preferably comprises a dielectric material that is harder than $SiO_2$ and has a higher Young's modulus than $SiO_2$.

For example, in one embodiment, the third hard mask 134 preferably comprises SiC. The SiC third hard mask 134 may comprise BLOk™ by Applied Materials, for example. SiC is a very hard material, having a Young's modulus E of 448 GPa, compared to $SiO_2$, which has a Young's modulus of 70–92 GPa, for example. The third hard mask 134 may comprise amorphous hydrogenated SiC, for example. In another embodiment, the third hard mask 134 may also comprise amorphous hydrogenated SiCN or SiON. The SiCN third hard mask 134 may comprise n-BLOk™ by Applied Materials, for example. The third hard mask 134 may alternatively comprise SiN, which has a Young's modulus of 130 to 146 GPa and is thus a harder material than $SiO_2$. For example, the third hard mask 134 may comprise a high quality low temperature SiN deposited by low temperature plasma, e.g., at 150 to 400 degrees C., as examples. The third hard mask may alternatively comprise another dielectric material having a Young's modulus greater than the Young's modulus of silicon dioxide.

In a preferred embodiment, the third hard mask 134 comprising SiC, SiON, SiCN, or SiN is typically deposited by plasma enhanced chemical vapor deposition (PECVD) techniques. The third hard mask 134 preferably comprises up to approximately 45% of hydrogen in addition to the Si, C, O, or N, for example. A silicon precursor such as $SiH_4$, tetraethoxysilate (TEOS), tetrametylcyclo-tetrasiloxane (TMCTS), octametylcyclo-tetrasiloxane (OMCTS) or trimetholsilane (TMS), as examples, is preferably used. An oxygen precursor such as $N_2O$, $O_2$, CO, or $CO_2$, as examples, is preferably used. A nitrogen precursor such as $N_2$ or $NH_3$, for example, is preferably used. TMS, TMCTS, OMCT, TEOS, CO, or $CO_2$, as examples, is preferably used as a carbon precursor.

The magnetic material layers of the MTJ stack 126 cannot withstand temperatures of over 400 degrees C.; therefore, it is important that the third hard mask 134 be deposited at a temperature of 400 degrees C. or lower. The third hard mask 134 preferably comprises a thickness x of approximately 1000 Angstroms, although alternatively, the third hard mask 134 may comprise a thickness of 500 to 2500 Angstroms, for example.

An ARC 136 is deposited over the third hard mask 134, and a photoresist 138 is deposited over the ARC 136, as shown. The photoresist 138 is patterned with the pattern that will be used to pattern the pinning layer 120, which will function as a bottom electrode of the MTJ stack 126.

Figure 5:
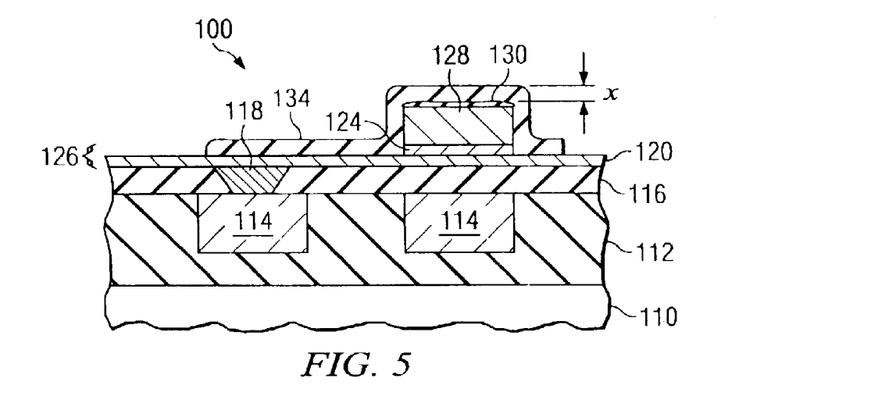

The photoresist 138 is used to pattern the third hard mask 134, as shown in FIG. 5. This is accomplished by opening the ARC 136, etching the exposed third hard mask 134, e.g., using RIE, followed by a photoresist 138 strip.

Figure 6:
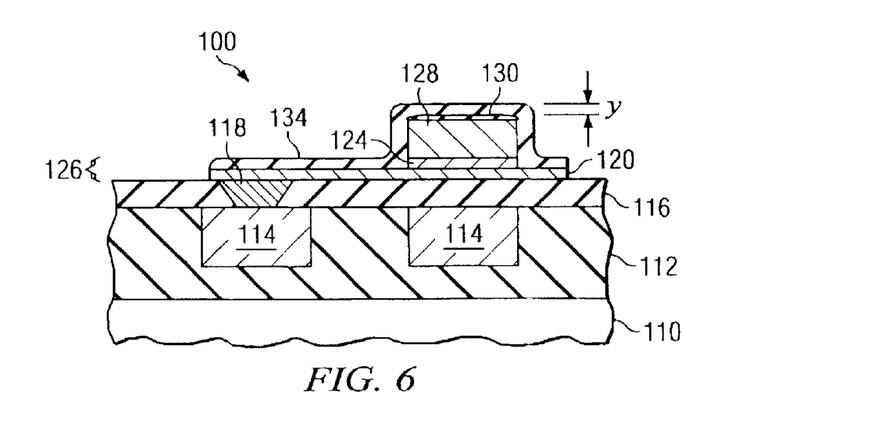

The third hard mask 134 is then used to pattern the underlying bottom electrode layers, in particular, the pinning layer 120, as shown in FIG. 6. The pinning layer 120 may be patterned using a dry RIE process, for example. The pinning layer 120 provides electrical contact of the fixed layer of the soft layer 124 to the via 118, which is electrically coupled to the underlying first conductive line 114. Because the third hard mask 134 is used to pattern the pinning layer 120, the pinning layer 120 has substantially the same lateral dimensions, e.g., in the direction perpendicular to the workpiece 110 surface, as the third hard mask 134.

A portion of the third hard mask 134 may be removed during the etch process of the pinning layer 120. For example, the third hard mask 134 may now have a thickness y that is less than thickness x (see FIG. 5) prior to the etch process. The third hard mask 134 may be 50 Angstroms, or may have a thickness ranging from 25 to 100 Angstroms after the patterning of the pinning layer 120, for example. It is advantageous for the third hard mask 134 to be left residing after the patterning of the pinning layer 120, to avoid exposing the magnetic layers of the soft layer 124 to the RIE chemistries during the etching of the pining layer 120, which are highly corrosive and can damage the soft layer 124 material, resulting in device failures or decreased performance of the magnetic memory device 100.

Figure 7:
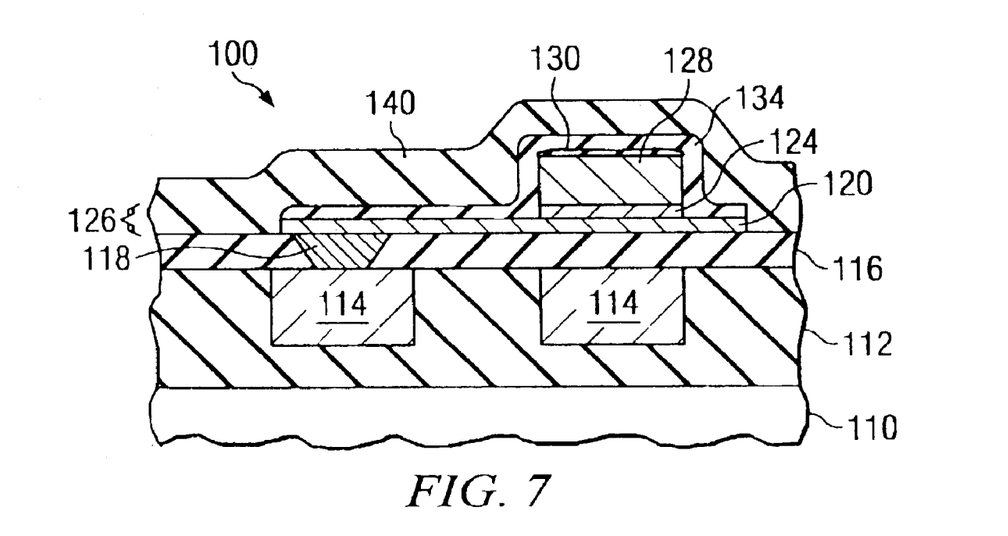

Next, as shown in FIG. 7, a third insulating layer 140 is deposited over the third hard mask 134 and exposed portions of the second insulating layer 116. The third insulating layer 140 preferably comprises a hard fill dielectric material that is harder than $SiO_2$. The third insulating layer 140 may comprise SiC deposited in a thickness exceeding the top surface of the first hard mask 128, for example. Alternatively, the third insulating layer 140 may be deposited to slightly underfill the topography of the top surface of the workpiece 110. The third insulating layer 140 may alternatively comprise SiN or another hard dielectric material having a high quality, to avoid scams, to be compatible with the subsequent chemical-mechanical polish (CMP) processing step (see FIG. 8), and in order to adequately function as an etch stop for the formation of the second conductive line trenches (see FIG. 10). In one embodiment, the third insulating layer 140 comprises the same material as the third hard mask 134. The third insulating layer 140 may comprise SiC, SiON, SiCN or SiN or another dielectric material having a Young's modulus greater than the Young's modulus of silicon dioxide, as examples.

Figure 8:
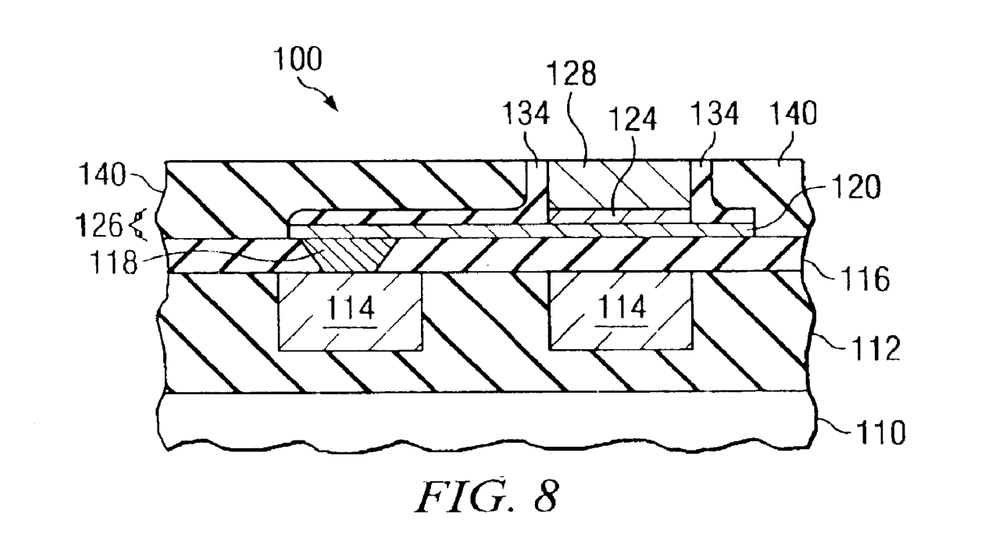

The workpiece 110 is then planarized, for example, using a CMP procedure, to remove the third insulating layer 140 from the top surface of the first hard mask 128, as shown in FIG. 8. Any second hard mask 130 still residing over the top surface of the first hard mask 128 is also removed during the planarization step. The CMP processing step may be designed to stop on the TiN material of the first hard mask 128, for example.

Figure 9:
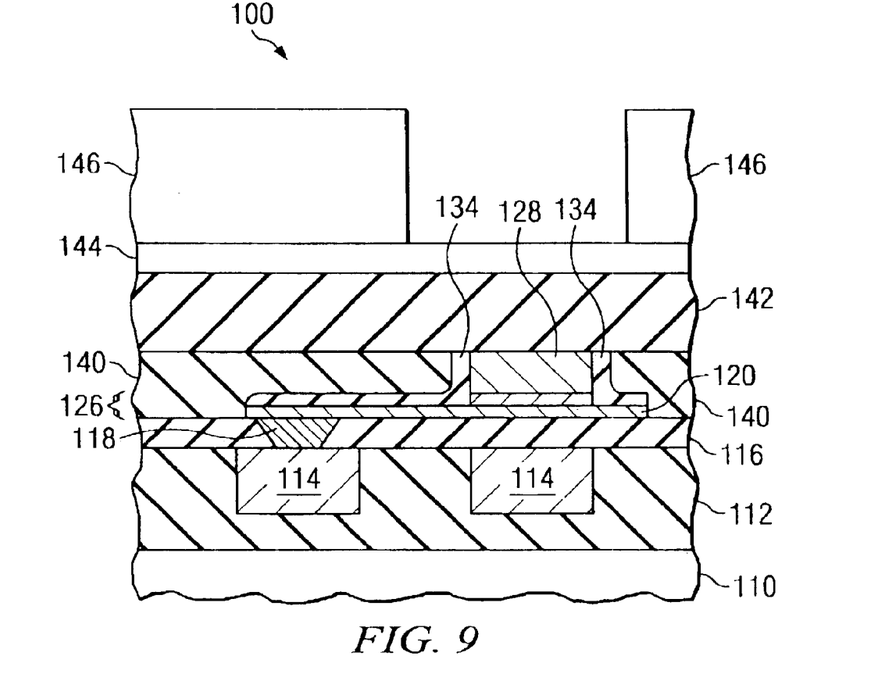

Next, a fourth insulating layer 142 is deposited over the third insulating layer 140 and exposed top surface of the first hard mask 128, as shown in FIG. 9. An ARC 144 is deposited over the fourth insulating layer 142, and a photoresist 146 is deposited over the ARC 144. The photoresist 146 is patterned with the pattern for the second conductive lines that will be formed within the fourth insulating layer 142, in a damascene process, for example, as shown in FIG. 9.

Figure 10:
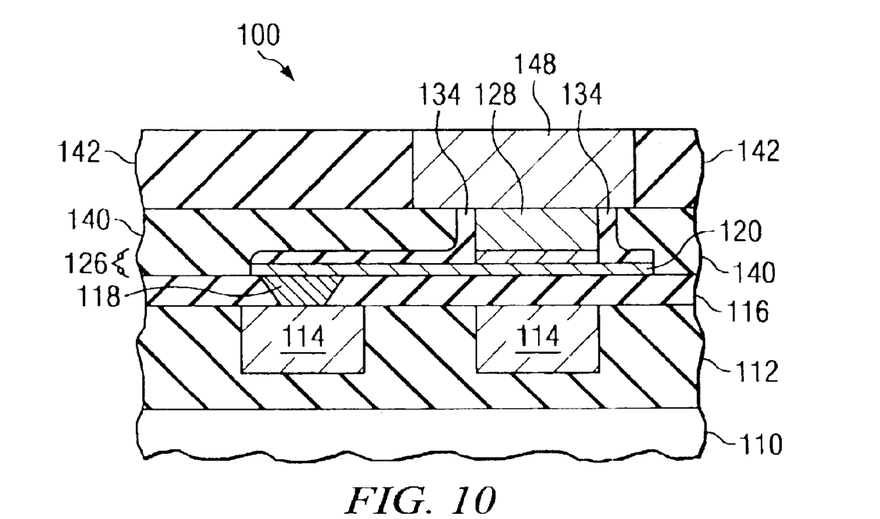

The ARC 144 is opened, and the photoresist 146 is used to pattern the fourth insulating layer 142 with trenches for the second conductive lines, as shown in FIG. 10. The photoresist 146 and ARC 144 are removed, and a conductive material comprising copper, aluminum, other metals, or combinations thereof, for example, is deposited over the fourth insulating layer 142 to form second conductive lines 148 that run in a different direction than the first conductive lines 114. Because the first hard mask 128 is conductive, the first hard mask 128 provides an electrical connection between the free (top) layer of the soft layer 124 and the second conductive line 148. The workpiece 110 is then planarized to remove excess conductive material from the top surface of the fourth insulating layer 142, and subsequent processes are performed to complete the manufacturing of the memory device 100.

Advantages of embodiments of the invention include providing a method of patterning a bottom electrode of a magnetic memory cell that avoids exposing the soft layer 124 of the magnetic stack 126 to harsh etchant chemistries after the soft layer 124 is patterned. The third hard mask 134 comprising SiC, SiON, SiCN or SiN comprises a strong material that is not completely removed during the patterning of the bottom electrode or pinning layer 120. Because the third hard mask 134 is disposed over the top surface and sidewalls of the first hard mask 128, and over the sidewalls of the patterned soft layer 124, the soft layer 124 is protected during the pinning layer 120 etch. This results in a more reliable MRAM device and improves device performance. In addition, because of the presence of the first hard mask 128 during the planarization step to remove the third insulating layer 140, the soft layer 124 is not exposed to any damaging chemistries during this process step, either.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that the materials and processes described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a bottom electrode of a magnetic memory cell, comprising:

depositing a pinning layer over a workpiece;

depositing a soft layer material over the pinning layer;

depositing a first hard mask over the soft layer material, the first hard mask comprising a conductive material;

patterning the first hard mask;

using the first hard mask to pattern the soft layer material and form at least one magnetic memory cell;

depositing a second hard mask over the first hard mask and exposed portions of the pinning layer, the second hard mask comprising a dielectric material having a Young's modulus greater than the Young's modulus of silicon dioxide;

patterning the second hard mask; and using the second hard mask to pattern the pinning layer and form a bottom electrode.

2. The method according to claim 1, wherein depositing the second hard mask comprises depositing SiC, SiON, SiCN or SiN.

3. The method according to claim 1, wherein depositing the second hard mask comprises depositing 500 to 2500 Angstroms of material.

4. The method according to claim 1, wherein depositing the first hard mask comprises depositing TiN.

5. The method according to claim 4, further comprising depositing a third hard mask over the first hard mask, prior to patterning the first hard mask, wherein patterning the first hard mask further comprises patterning the third hard mask.

6. The method according to claim 5, wherein depositing the third hard mask comprises depositing $SiO_2$.

7. The method according to claim 1, further comprising:

depositing a first insulating layer over the second hard mask; and planarizing the workpiece to remove portions of the first insulating layer from over a top surface of the first hard mask.

8. The method according to claim 7, wherein depositing the first insulating layer comprises depositing SiC, SiON, SiCN or SiN.

9. The method according to claim 7, wherein depositing the first insulating layer comprises depositing the first insulating layer in a thickness greater than the top surface of the first hard mask.

10. The method according to claim 7, further comprising:

before depositing a pinning layer, forming at least one first conductive line over the workpiece;

depositing a second insulating layer over the at least one first conductive line adjacent the pinning layer;

forming at least one via in the second insulating layer, the via abutting and making electrical contact to the at least one first conductive line and the pinning layer;

depositing a third insulating layer over the first hard mask top surface and the first insulating layer; and forming at least one second conductive line in the third insulating layer, wherein the at least one second conductive line makes electrical contact to an upper portion of the magnetic memory cell.

11. The method according to claim 1, wherein depositing the soft layer material comprises depositing a first magnetic layer over the pinning layer, depositing a thin oxide layer over the first magnetic layer, and depositing a second magnetic layer over the thin oxide layer, wherein the at least one magnetic memory cell comprises a magnetic random access memory (MRAM) cell.

12. The method according to claim 1, wherein after patterning the pinning layer, at least a portion of the second hard mask remains residing over at least the patterned soft layer sidewalls and a top surface of the first hard mask.

13. A method of manufacturing a magnetic memory device, comprising:

providing a workpiece;

depositing a first insulating layer over the workpiece;

forming at least one first conductive line in the first insulating layer;

depositing a second insulating layer over the at least one first conductive line and first insulating layer;

forming a via within the second insulating layer, the via abutting the at least one first conductive line;

depositing a pinning layer over the via and second insulating layer;

depositing a soft layer material over the pinning layer;

depositing a first hard mask over the soft layer material, the first hard mask comprising a conductive material;

patterning the first hard mask;

using the first hard mask to pattern the soft layer material and form at least one magnetic memory cell;

depositing a second hard mask over the first hard mask and exposed portions of the pinning layer, the second hard mask comprising a dielectric material having a Young's modulus greater than the Young's modulus of silicon dioxide;

patterning the second hard mask;

using the second hard mask to pattern the pinning layer;

depositing a third insulating layer over the second hard mask, the third hard mask comprising a dielectric material having a Young's modulus greater than the Young's modulus of silicon dioxide; and planarizing the workpiece to remove portions of the third insulating layer from over a top surface of the first hard mask.

14. The method according to claim 13, wherein depositing the second hard mask comprises depositing SiC, SiON, SiCN or SiN, and wherein depositing the third insulating layer comprises depositing SiC, SiON, SiCN or SiN.

15. The method according to claim 13, wherein depositing the second hard mask comprises depositing 500 to 2500 Angstroms of material.

16. The method according to claim 13, wherein depositing the first hard mask comprises depositing TiN.

17. The method according to claim 13, further comprising depositing a third hard mask over the first hard mask, prior to patterning the first hard mask, wherein patterning the first hard mask further comprises patterning the third hard mask.

18. The method according to claim 17, wherein depositing the third hard mask comprises depositing $SiO_2$.

19. The method according to claim 13, wherein depositing the third insulating layer comprises depositing the same material as the second hard mask material.

20. The method according to claim 13, wherein depositing the third insulating layer comprises depositing the third insulating layer in a thickness greater than the top surface of the first hard mask.

21. The method according to claim 13, further comprising:

depositing a fourth insulating layer over the first hard mask top surface and the third insulating layer; and forming at least one second conductive line in the fourth insulating layer, wherein the at least one second conductive line makes electrical contact to an upper portion of the magnetic memory cell.

22. The method according to claim 13, wherein depositing the soft layer material comprises depositing a first magnetic layer over the pinning layer, depositing a thin oxide layer over the first magnetic layer, and depositing a second magnetic layer over the thin oxide layer, wherein the at least one magnetic memory cell comprises a magnetic random access memory (MRAM) cell.

23. The method according to claim 13, wherein at least a portion of the second hard mask remains residing over a top surface of the first hard mask and over sidewalls of the soft layer after patterning the pinning layer.

24. A magnetic memory device, comprising:
   a workpiece;
   at least one first conductive line disposed over the workpiece;
   a pinning layer coupled to the at least one first conductive line;
   a soft layer disposed over the pinning layer, the soft layer having sidewalls and comprising a magnetic memory cell;
   a first hard mask disposed over the soft layer, the first hard mask having substantially the same lateral dimensions as the soft layer, the first hard mask having sidewalls and a top surface, the first hard mask being conductive;
   a second hard mask disposed over the pinning layer, the top surface and sidewalls of the first hard mask, and over the sidewalls of the soft layer, wherein the second hard mask comprises substantially the same lateral dimensions as the pinning layer, wherein the second hard mask comprises SiC, SiON, SiCN or SiN;
   a first insulating layer disposed over at least the second hard mask, wherein the first insulating layer comprises SiC, SiON, SiCN or SiN; and
   at least one second conductive line disposed over and abutting the first hard mask, wherein the at least one second conductive line runs in a different direction than the at least one first conductive line.

25. The magnetic memory device according to claim 24, wherein the soft layer and pinning layer comprise a magnetic tunnel junction, wherein the memory device comprises a magnetic random access memory (MRAM) device.

26. The magnetic memory device according to claim 24, wherein the first hard mask comprises TiN.

* * * * *